US007800394B2

(12) United States Patent
Kato

(10) Patent No.: US 7,800,394 B2
(45) Date of Patent: Sep. 21, 2010

(54) DISPLAY DEVICE, DRIVING METHOD THEREOF, AND ELECTRONIC APPLIANCE

(75) Inventor: Taichi Kato, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 96 days.

(21) Appl. No.: 11/550,990

(22) Filed: Oct. 19, 2006

(65) Prior Publication Data

US 2007/0091047 A1 Apr. 26, 2007

(30) Foreign Application Priority Data

Oct. 21, 2005 (JP) ............................ 2005-307715

(51) Int. Cl.
*G01R 31/00* (2006.01)

(52) U.S. Cl. ...................................................... 324/770

(58) Field of Classification Search ......... 324/769–770; 345/76–77
See application file for complete search history.

(56) References Cited

U.S. PATENT DOCUMENTS 5,986,632 A 11/1999 Takayama et al.
6,335,716 B1 * 1/2002 Yamazaki et al. ............. 345/92
6,362,643 B1 * 3/2002 Kim ........................... 324/770
6,518,941 B1 2/2003 Kimura
6,535,193 B1 3/2003 Mizutome et al.
6,614,417 B2 * 9/2003 Murade ....................... 345/98
6,756,740 B2 * 6/2004 Inukai ..................... 315/169.3
6,774,574 B1 8/2004 Koyama
6,777,887 B2 8/2004 Koyama
6,972,746 B1 12/2005 Takayama et al.
7,113,154 B1 * 9/2006 Inukai ......................... 345/76
7,129,918 B2 10/2006 Kimura
7,227,519 B1 * 6/2007 Kawase et al. ................ 345/77
7,298,357 B2 11/2007 Takayama et al.
2001/0022570 A1 9/2001 Chang et al.
2002/0153844 A1 10/2002 Koyama
2003/0071772 A1 4/2003 Kimura
2003/0071804 A1 * 4/2003 Yamazaki et al. ........... 345/204
2003/0098833 A1 5/2003 Sekido et al.
2004/0021625 A1 2/2004 Lee
2004/0207331 A1 10/2004 Koyama (Continued)

FOREIGN PATENT DOCUMENTS

EP 0 949 603 A1 10/1999

(Continued)

OTHER PUBLICATIONS

European Search Report (Application No. 06021779.1) dated Jul. 28, 2008 (7 pages).

*Primary Examiner*—Ha Tran T Nguyen
*Assistant Examiner*—Arleen M Vazquez
(74) *Attorney, Agent, or Firm*—Fish & Richardson P.C.

(57) ABSTRACT

It is an object to correct a gap of a rise of a gate signal caused by characteristics of a transistor. In a display device, black is accurately displayed by using an inspecting circuit and a signal correcting circuit. In the case where a gate signal lags due to characteristics of a transistor, and the like, black cannot be accurately displayed at timing to display black in some cases. In such a case, a defect of the gate signal is detected by the inspecting circuit, and the gate signal is corrected by the signal correcting circuit.

9 Claims, 16 Drawing Sheets

U.S. PATENT DOCUMENTS

| | | | | |
|---|---|---|---|---|
| 2005/0099371 | A1 | 5/2005 | Koyama | |
| 2005/0200377 | A1 * | 9/2005 | Orii et al. | 324/770 |
| 2006/0221035 | A1 | 10/2006 | Lee | |
| 2006/0255827 | A1 * | 11/2006 | Nara et al. | 324/770 |
| 2007/0115223 | A1 | 5/2007 | Kimura | |

FOREIGN PATENT DOCUMENTS

| | | | |
|---|---|---|---|
| EP | 1 063 630 | A2 | 12/2000 |
| EP | 1 103 946 | A2 | 5/2001 |
| JP | 10-239665 | | 9/1998 |
| JP | 11-073158 | | 3/1999 |
| JP | 2001-005426 | | 1/2001 |
| JP | 2001-343933 | | 12/2001 |

* cited by examiner

FIG. 5A

| INPUT | | OUTPUT |
|---|---|---|
| L | L | L |
| L | H | H |
| H | L | H |
| H | H | L |

FIG. 5B

| INPUT | OUTPUT |
|---|---|
| L | H |
| H | L |

FIG. 5C

| INPUT | | OUTPUT |
|---|---|---|
| L | L | H |
| L | H | L |
| H | L | L |
| H | H | H |

FIG. 5D

| INPUT | | OUTPUT |
|---|---|---|
| L | L | H |
| L | H | H |
| H | L | H |
| H | H | L |

FIG. 8A

| INPUT | | OUTPUT |
|---|---|---|
| L | L | L |
| L | H | L |
| H | L | L |
| H | H | H |

FIG. 8 B

| INPUT | | OUTPUT |
|---|---|---|
| L | L | H |
| L | H | L |
| H | L | L |
| H | H | L |

DISPLAY DEVICE, DRIVING METHOD THEREOF, AND ELECTRONIC APPLIANCE

BACKGROUND OF THE INVENTION

1. Field of the Invention

The present invention relates to a display device. Further, the invention relates to an electronic appliance having the display device for a display portion.

2. Description of the Related Art

In recent years, a thin display device having pixels formed using self-luminous light emitting elements has attracted attention. As a light emitting element, an organic light emitting diode (OLED) or an EL (electroluminescent) element has attracted attention, and have been used for an organic EL display or the like.

As a driving method for expressing a multi-gray scale image of a display device using the aforementioned light emitting element, there are an analog driving method (analog gray scale method) and a digital driving method (digital gray scale method).

The analog driving method is a method in which current magnitude flowing in a light emitting element is continuously controlled to obtain a gray scale. Whereas, the digital driving method is a method in which a light emitting element is driven by only two states of an ON state (a lighting state with the luminance of approximately 100%) and an OFF state (a state where the luminance is approximately 0%, that is, a non-lighting state).

Next, brief description is made of an example of a pixel structure of a display device employing the time gray scale method and drive thereof. A circuit shown in FIG. 1 includes transistors 201 and 202, and a light emitting element 203. A gate electrode, a first electrode, and a second electrode of the transistor 201 are connected to a gate signal line 205, a source signal line 204, and a gate electrode of the transistor 202 respectively. A first electrode and a second electrode of the transistor 202 are connected to a power source line 206 and a first electrode of the light emitting element 203 respectively. A second electrode of the light emitting element 203 is connected to a counter electrode.

Note that it is difficult to define a source electrode and a drain electrode of a thin film transistor (hereinafter referred to as TFT) due to a structure thereof. Here, one of a source electrode and a drain electrode is referred to as a first electrode, and the other is referred to as a second electrode. In general, a lower potential side electrode is a source electrode and a higher potential side electrode is a drain electrode in an n-channel transistor, whereas a higher potential side electrode is a source electrode and a lower potential side electrode is a drain electrode in a p-channel transistor. Accordingly, in the case where there is description concerning a gate-source voltage or the like in description of circuit operation, the aforementioned basis is referred.

Subsequently, description of FIG. 1 is made with reference to a timing chart in FIG. 2. The source signal line 204 to be selected is determined by an SWE211 (source writing/erasing select signal). Further, the gate signal line 205 to be selected is determined by a GIWE212 (gate writing select signal) and a G2WE213 (gate erasing select signal). Whether the light emitting element 203 emits light or no light is determined by signals of the source signal line 204 and the gate signal line 205. Here, as for an arbitrary wiring, a digital signal "1" is referred to as H (High level), whereas "0" is referred to as L (Low level). It is to be noted that "0" means not only a ground potential but a common potential. A state where a potential is higher than an arbitrary threshold voltage may be H, whereas a state where a potential is lower than an arbitrary threshold voltage may be L.

Black is written when the source signal 214 is H. However, if the gate signal 215 is not H at that time, such data is not reflected to the light emitting element 203. Meanwhile, white, that is, data is written when the source signal 214 is L. However, if the gate signal 215 is not H, such data is not reflected to the light emitting element 203.

Subsequently, the digital driving method is described. With the digital driving method alone, only 2 gray scales can be expressed. Therefore, it is suggested that the digital driving method be used in combination with a driving method for expressing multi gray scales, such as an area gray scale method or a time gray scale method. The area gray scale method is a method in which gray scale is expressed depending on the size of a light emitting area of a sub-pixel provided in a pixel (for example, see Patent Document 1). Further, the time gray scale method is a method in which gray scale is expressed by controlling a light-emitting period and light-emitting frequency (for example, see Patent Documents 2 and 3).

[Patent Document 1] Japanese Published Patent Application No. H11-73158

[Patent Document 2] Japanese Published Patent Application No. 2001-5426

[Patent Document 3] Japanese Published Patent Application No. 2001-343933

SUMMARY OF THE INVENTION

In the aforementioned time gray scale method, whether the light emitting element 203 emits light or no light is determined by the source signal line 204 and the gate signal line 205. Therefore, signals of the source signal line 204 and the gate signal line 205 are required to be accurately inputted to the transistor 201 and the light emitting element 203.

However, a lag is actually caused by characteristics of a TFT or the like. Therefore, a gap is generated in timing of the gate signal 215. This is particularly remarkable in the case of black display. Description is made below with reference to FIG. 3. In the case of black display, when the source signal 214 of the source signal line is H, the gate signal 215 of the gate signal line is normally required to be H in FIG. 3 due to only a slight gap (gap by only T/8 shown in FIG. 3) caused by a lag or the like. However, even when the gate signal 215 lags and the source signal 214 is set to L, the gate signal 215 is in an H state and data is written. Thus, a pixel which is normally displayed in black is displayed in white even if only slightly, which becomes a problem as a display defect.

For that reason, a panel is normally required to be designed considering characteristics of a TFT. However, it is difficult to consider the characteristics of all TFTs in the panel because of high definition and the like.

The invention provides a display device for identifying a position of a defect signal, that is non-lighting light emitting element, and thus preventing a display defect, in view of the aforementioned problems.

The invention suggests a signal correcting circuit and an inspecting circuit for accurately inputting signals to a transistor and a light emitting element. In particular, the invention provides a signal correcting circuit and an inspecting circuit for identifying a position of a display defect signal and accurately inputting signals to a transistor and a light emitting element in the case of black display.

Specifically, a different signal is inputted between lighting time and non-lighting time of the light emitting element. The invention, focusing on signals in the case of non-light emission, has a circuit configuration where signals are inspected while operation of the light emitting element is not prevented in a state where the light emitting element emits light. On the other hand, in the case where there is a defect signal, the defect signal is corrected to an accurate signal so as to be continuously inputted to the transistor and the light emitting element.

One mode of the invention is a display device including a first wiring, a second wiring, a pixel connected to the first wiring and the second wiring, to which a signal is written from the second wiring when the first wiring is selected, and a circuit which detects whether the first wiring is selected or not when the signal of the second wiring changes.

Another mode of the invention is a display device including a first wiring, a second wiring, a driver circuit which outputs a signal to the first wiring, a pixel connected to the first wiring and the second wiring, to which a signal is written from the second wiring when the first wiring is selected, and an inspecting circuit which detects whether the first wiring is selected or not when the signal of the second wiring changes. The driver circuit includes a signal correcting circuit to which data detected by the inspecting circuit is inputted and which corrects timing to output a signal to the first wiring in accordance with the data.

Another mode of the invention is a display device having the aforementioned structure, in which the signal correcting circuit includes a plurality of buffer circuits connected in series and corrects timing to output a signal to the first wiring.

Another mode of the invention is an electronic appliance having the display device of the aforementioned structure.

Another mode of the invention is a driving method of a display device including a first wiring, a second wiring, a first driver circuit which outputs a signal to the first wiring, a second driver circuit which outputs a signal to the second wiring, and a pixel connected to the first wiring and the second wiring, to which a signal is written from the second wiring when the first wiring is selected. The first driver circuit detects whether the first wiring is selected or not when the signal of the second wiring changes, and corrects timing to output a signal to the first wiring.

Another mode of the invention is a driving method of a display device, in which a plurality of buffer circuits connected in series is used for correcting the aforementioned timing in the aforementioned driving method.

By the invention, whether a panel has a defect or not is easily determined, and thus time required for inspection can be reduced, even when a defect signal is inputted to a writing transistor and a light emitting element. Further, the display device of the invention can reduce a display defect by having a circuit configuration where a position of a defect signal is identified and corrected even when a defect signal is inputted to the writing transistor and the light emitting element, and a correct signal can be inputted to the writing transistor and the light emitting element.

BRIEF DESCRIPTION OF DRAWINGS

FIGS. 5A to 5D each show a truth table 1.

FIGS. 8A and 8B each show a truth table 2.

DETAILED DESCRIPTION OF THE INVENTION

Figure 1:
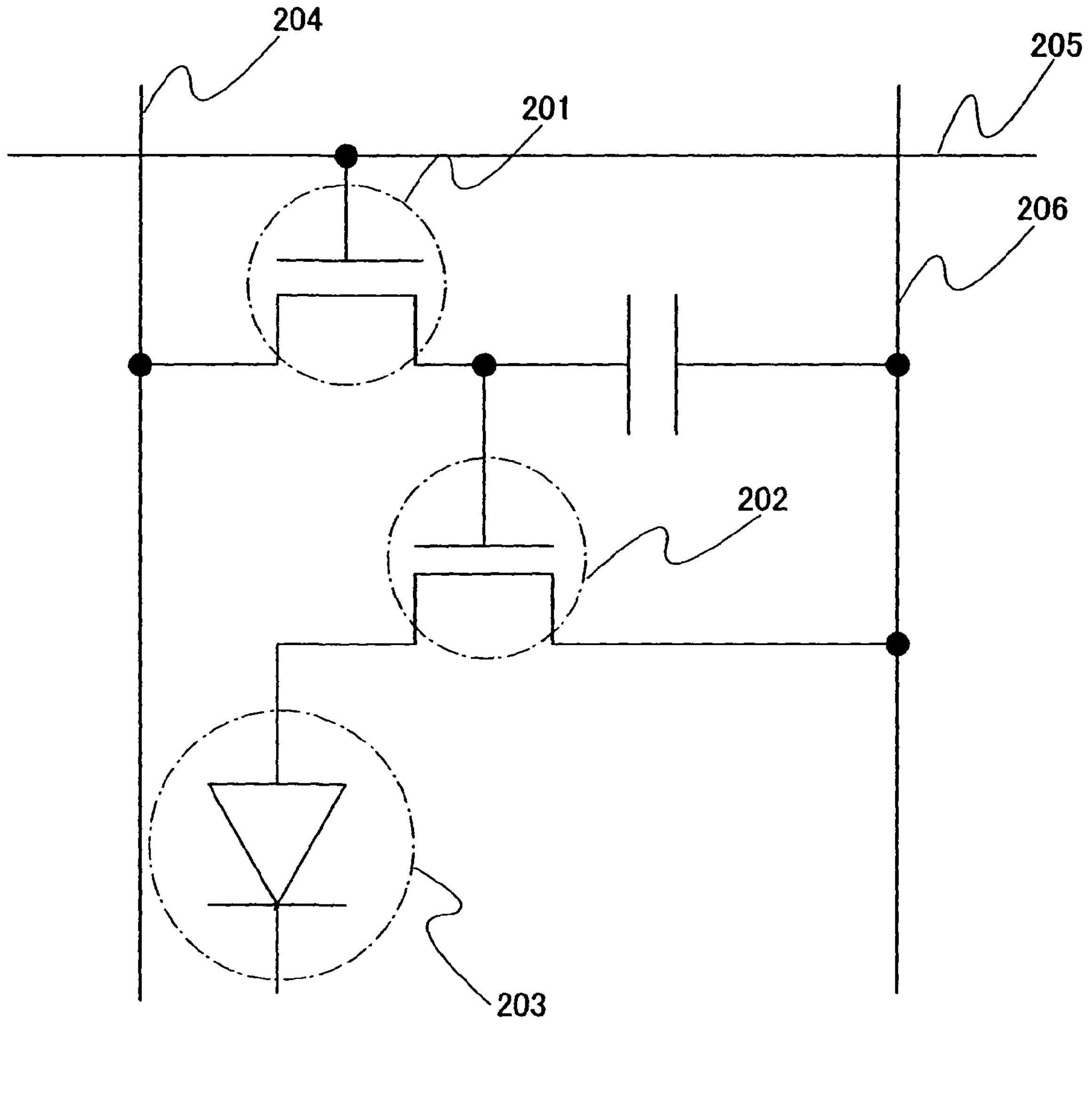
FIG. 1 is a pixel circuit diagram.
Figure 2:
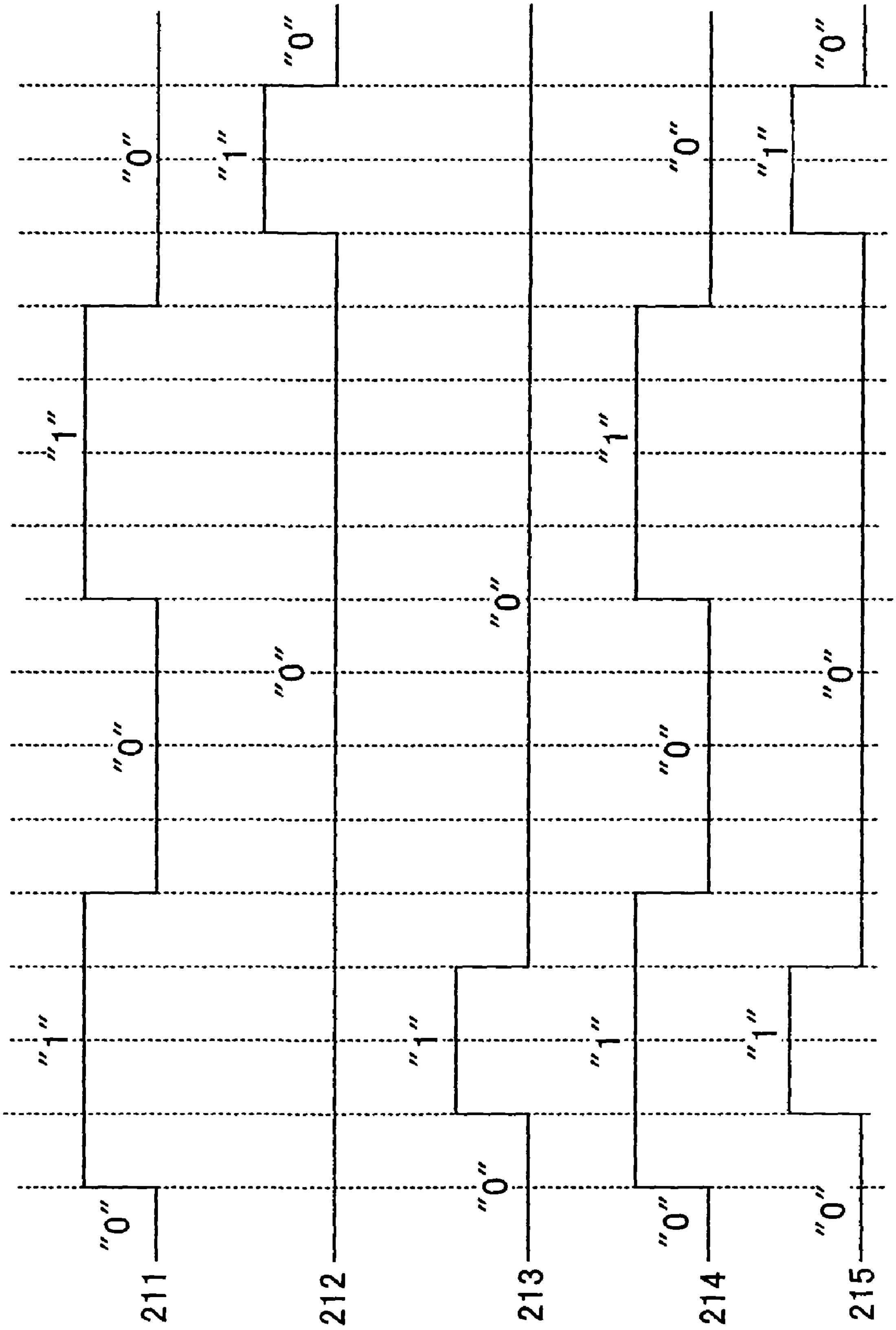
FIG. 2 is a timing chart in a normal case, of the invention.
Figure 3:
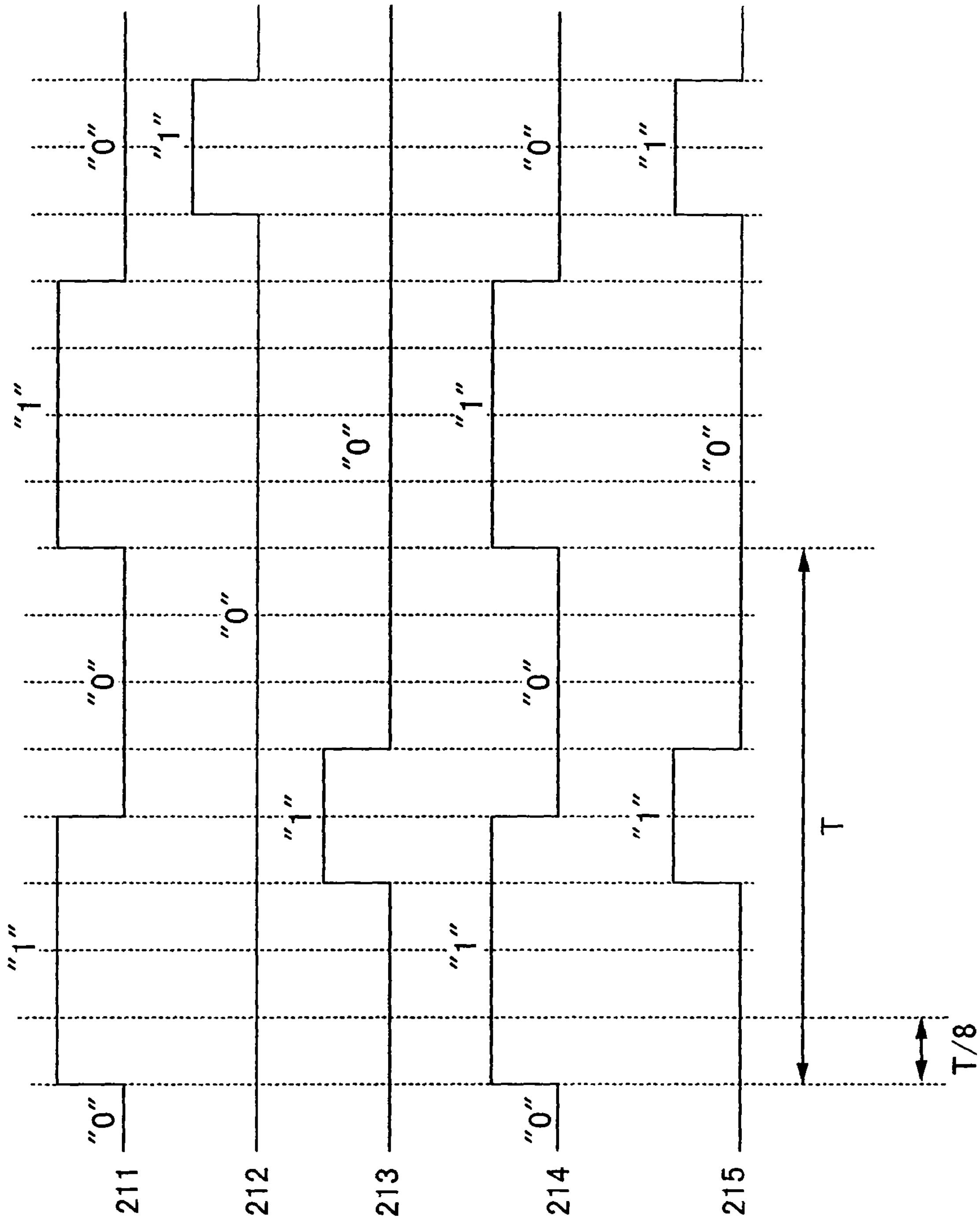
FIG. 3 is a timing chart in a defective case, of the invention.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein.

Note that common portions and portions having a similar function are denoted by the same reference numerals in all diagrams for describing embodiment modes, and description thereof is omitted.

EMBODIMENT MODE 1

In this embodiment mode, description is made of an inspecting circuit of the invention, a display device to which the inspecting circuit can be applied, and a driving method of the display device.

Figure 16A:
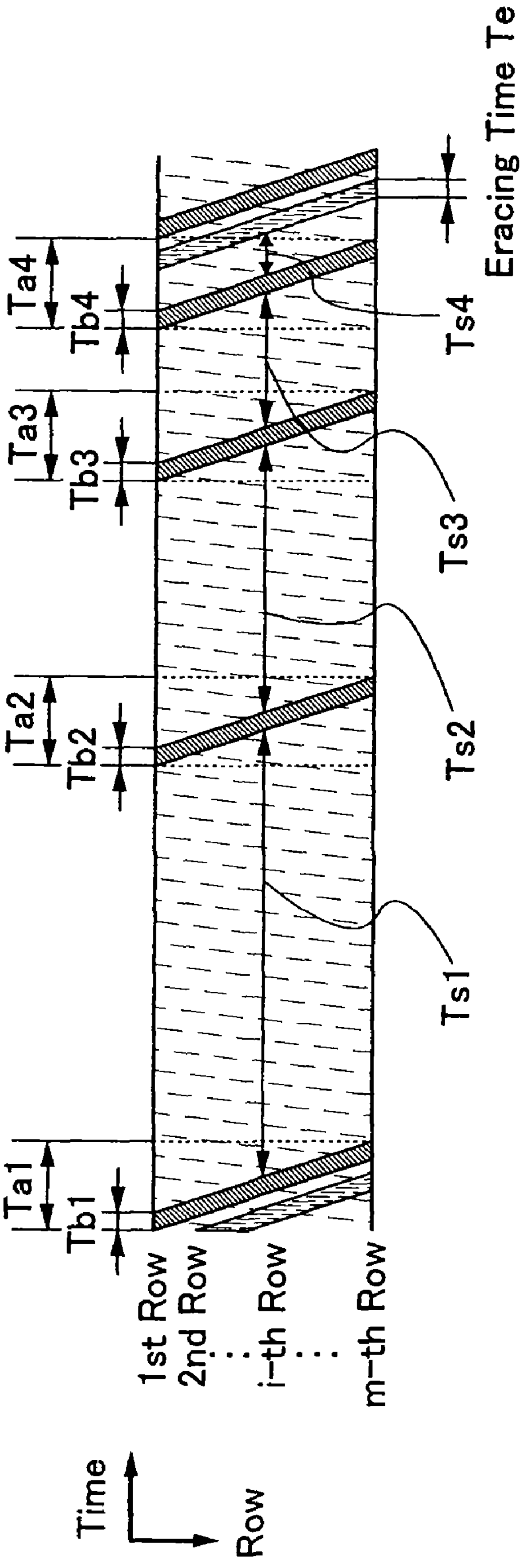
FIGS. 16A and 16B each show an explanatory diagram of a driving method.

First, the driving method of the display device is described with reference to FIG. 16.

In an address period Ta1, signals are sequentially inputted to a gate signal line from the first row, thereby an arbitrary pixel is selected. Then, when the pixel is selected, a signal is inputted to the pixel from a source signal line. After the signal is written from the source signal line to the pixel, the pixel holds the signal until a signal is inputted again. Depending on the written signal, each pixel is controlled to emit light or no light in a sustain period Ts1. That is, in the row where the signal from the source signal line has finished to be written, each pixel is immediately in a lighting state or a non-lighting state in accordance with the written signal. The same operation is performed up to the last row, and the address period Ta1 terminates. Then, the row where the sustain period has terminated sequentially starts a signal writing operation of a next subframe period. In this manner, a signal is inputted to a pixel similarly in address periods Ta2, Ta3, and Ta4, and depending on the signal thereof, each pixel is controlled to emit light or no light in sustain periods Ts2, Ts3, and Ts4. Then, the termination of the sustain period Ts4 is set by the start of an erasing operation. This is because, when the signal written to the pixel is erased in erasing time Te of each row, the pixel is forced to be in a non-lighting state regardless of the signal written to the pixel in the address period until signal writing is performed to a next pixel. In other words, the sustain period terminates from a pixel in a row where the erasing time Te starts.

Thus, a display device having a shorter address period, a high level gray scale, and a high duty ratio can be provided without separating the address period and the sustain period. Here, a duty ratio means the ratio of a lighting period to one frame period. In addition, the reliability of the display element can be improved since instantaneous luminance can be lowered.

Figure 15:
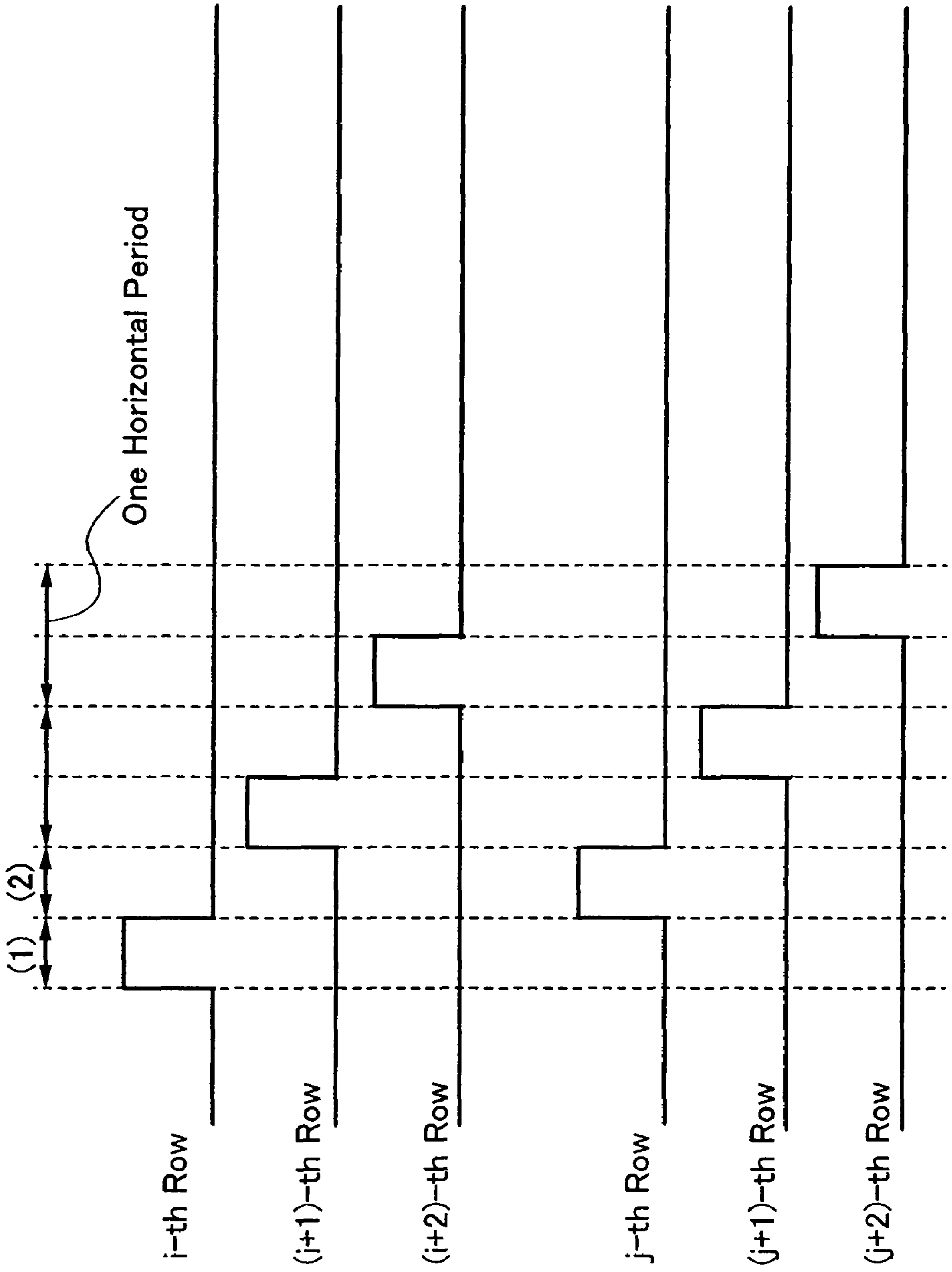
FIG. 15 is a timing chart of a display device of FIG. 14.
Figure 16B:
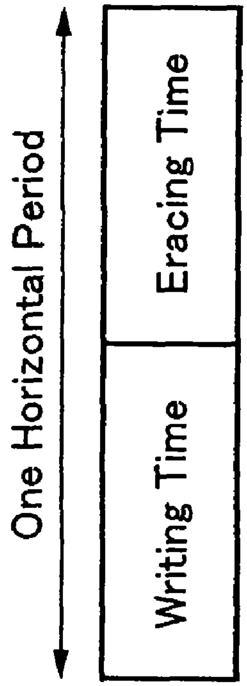

The aforementioned driving method can be realized in the case of a circuit configuration shown in FIG. 1. A gray scale in the case where the sustain period is shorter than the address period as Ta4 and Ts4 in FIG. 16A can be expressed by providing writing time and erasing time in one horizontal period as shown in FIG. 16B. For example, one horizontal period is divided into two periods as shown in FIG. 15. Here, description is made assuming that the former half is writing time and the latter half is erasing time. That is to say, in FIG. 15, the writing time is (1) and the erasing time is (2) in one horizontal period. In the divided horizontal period, each gate signal line 205 is selected, and at that time, a corresponding signal is inputted to the source signal line 204. For example, an i-th row is selected in the former half of a certain horizontal period and a j-th row is selected in the latter half thereof. Then, operation can be performed as if two rows are selected at the same time in one horizontal period. In other words, the signals are written to pixels from the source signal line 204 in writing time Tb1 to Tb4 using writing time that is the former half of each horizontal period. Then, a pixel is not selected in erasing time that is the latter half of the one horizontal period in this case. In addition, a signal is inputted to a pixel from the source signal line 204 in erasing time Te using erasing time that is the latter half of another horizontal period. In writing time that is the former half of one horizontal period at this time, a pixel is not selected. Thus, a display device including a pixel having a high aperture ratio can be provided and a yield can be improved.

Figure 14:
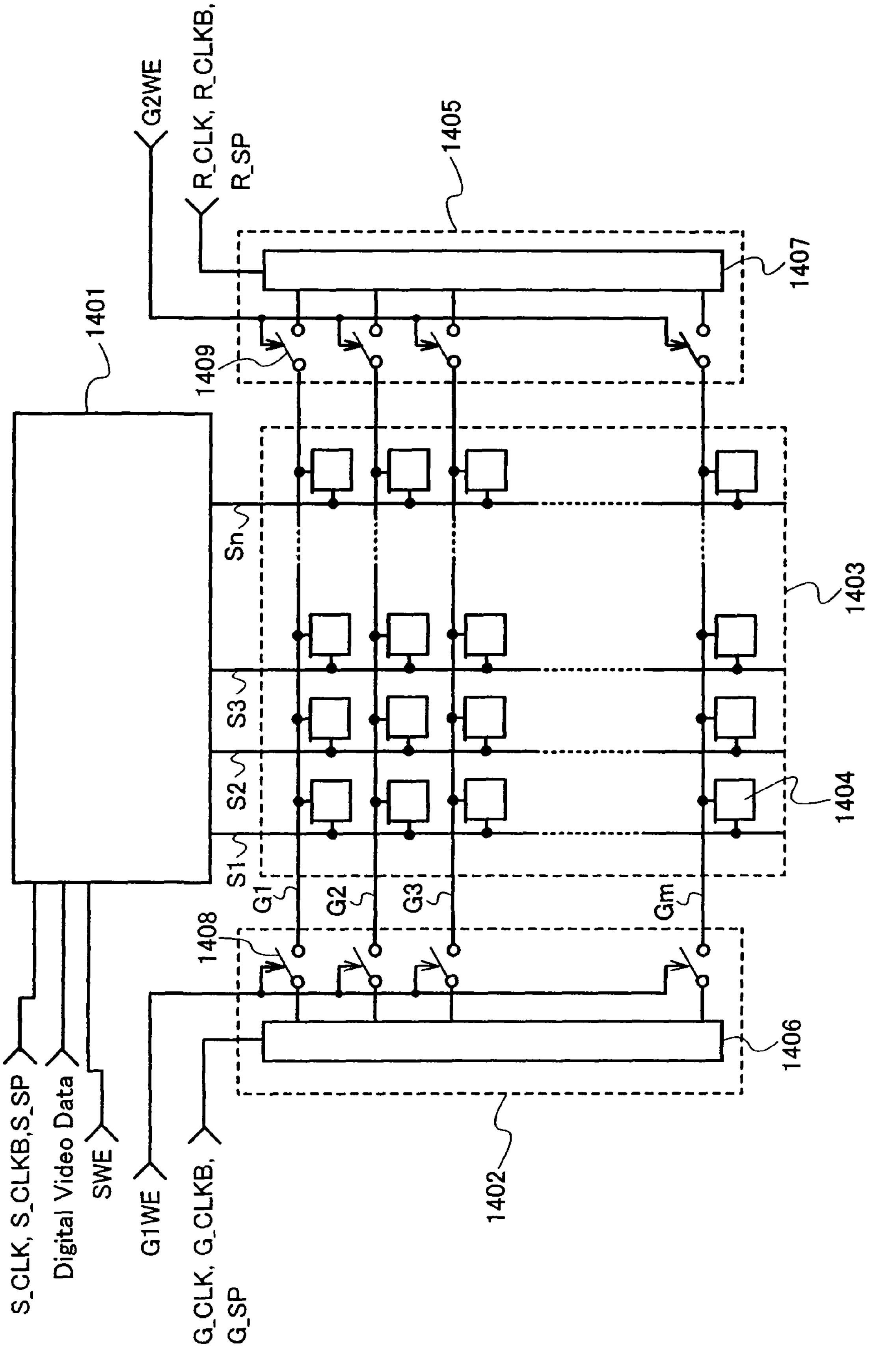
FIG. 14 is an explanatory diagram of a configuration of a display device.

Further, FIG. 14 shows an example of a circuit configuration of the display device driving in the aforementioned manner.

In FIG. 14, the display device includes a first driver circuit 1401, a second driver circuit 1402, a third driver circuit 1405, and a pixel portion 1403. In the pixel portion 1403, a pixel 1404 is arranged in matrix corresponding to gate signal lines G1 to Gm and source signal lines S1 to Sn. The second driver circuit 1402 includes a first shift register circuit 1406 and a switch 1408 which controls to electrically connect or disconnect between the first shift register circuit 1406 and each of the gate signal lines G1 to Gm. The switch 1408 may be any means as long as it controls to electrically connect or disconnect between the first shift register circuit 1406 and each of the gate signal lines G1 to Gm as required, and may be formed of a transistor or the like. Further, the third driver circuit 1405 includes a second shift register circuit 1407 and a switch 1409 which controls to electrically connect or disconnect between the second shift register circuit 1407 and each of the gate signal lines G1 to Gm. The switch 1409 may be any means as long as it controls to electrically connect or disconnect between the second shift register circuit 1407 and each of the gate signal lines G1 to Gm as required, and may be formed of a transistor or the like.

It is to be noted that a gate signal line Gp (represents one of the gate signal lines G1 to Gm) corresponds to the gate signal line 205 of FIG. 1, and a source signal line Sq (represents one of the signal lines S1 to Sn) corresponds to the source signal line 204 of FIG. 1.

A clock signal (G_CLK), an inverted clock signal (G_CLKB), a start pulse signal (G_SP), a gate writing select signal (G1WE), and the like are inputted to the second driver circuit 1402. In accordance with these signals, signals to select pixels are outputted to a gate signal line Gp (one of the gate signal lines G1 to Gm) of a pixel row to be selected. Note that the signals outputted at this time are pulses outputted in the former half of one horizontal period as shown in a timing chart of FIG. 15. That is, the signals outputted from the first shift register circuit 1406 are outputted to the gate signal lines G1 to Gm only when the switch 1408 is on.

A clock signal (R_CLK), an inverted clock signal (R_CLKB), a start pulse signal (R_SP), a gate erasing select signal (G2WE), and the like are inputted to the third driver circuit 1405. In accordance with these signals, signals are outputted to a gate signal line Ri (one of the gate signal lines R1 to Rm) of a pixel row to be selected. Note that the signals outputted at this time are pulses outputted in the latter half of one horizontal period as shown in the timing chart of FIG. 15. That is, the signals outputted from the second shift register circuit 1407 are outputted to the gate signal lines G1 to Gm only when the switch 1409 is on.

A clock signal (S_CLK), an inverted clock signal (S_CLKB), a start pulse signal (S_SP), a digital video signal (Digital Video Data), an output control signal (SWE), and the like are inputted to the first driver circuit 1401. In accordance with these signals, a signal corresponding to pixels of each column is outputted to each of the source signal lines S1 to Sn. The signals outputted from the first driver circuit 1401 are controlled by the output control signal (SWE).

Therefore, the digital video signal inputted to the source signal lines S1 to Sn is written to the pixel 1404 of each column in the pixel row selected by a signal inputted to the gate signal line Gp (one of the gate signal lines G1 to Gm) from the second driver circuit 1402. Then, each pixel row is selected by each of the gate signal lines G1 to Gm, thereby digital video signals corresponding to each of the pixels 1404 are written to all the pixels 1404. Each of the pixels 1404 holds the data of the written digital video signal for a certain period. Then, each of the pixels 1404 can keep a lighting state or a non-lighting state by holding the data of the video signal for a certain period.

Further, an erasing signal for making a pixel emit no light is written from the source signal lines S1 to Sn to the pixel 1404 of each column in the pixel row selected by a signal inputted to the gate signal line Gp (one of the gate signal lines G1 to Gm) from the third driver circuit 1405. Then, each pixel row is selected by each of the gate signal lines G1 to Gm, thereby a non-light emitting period can be set. For example, the time when the pixel in a p-th row is selected by the signal inputted from the third driver circuit 1405 to the gate signal line Gp corresponds to erasing time Te in FIG. 16.

Figure 4:
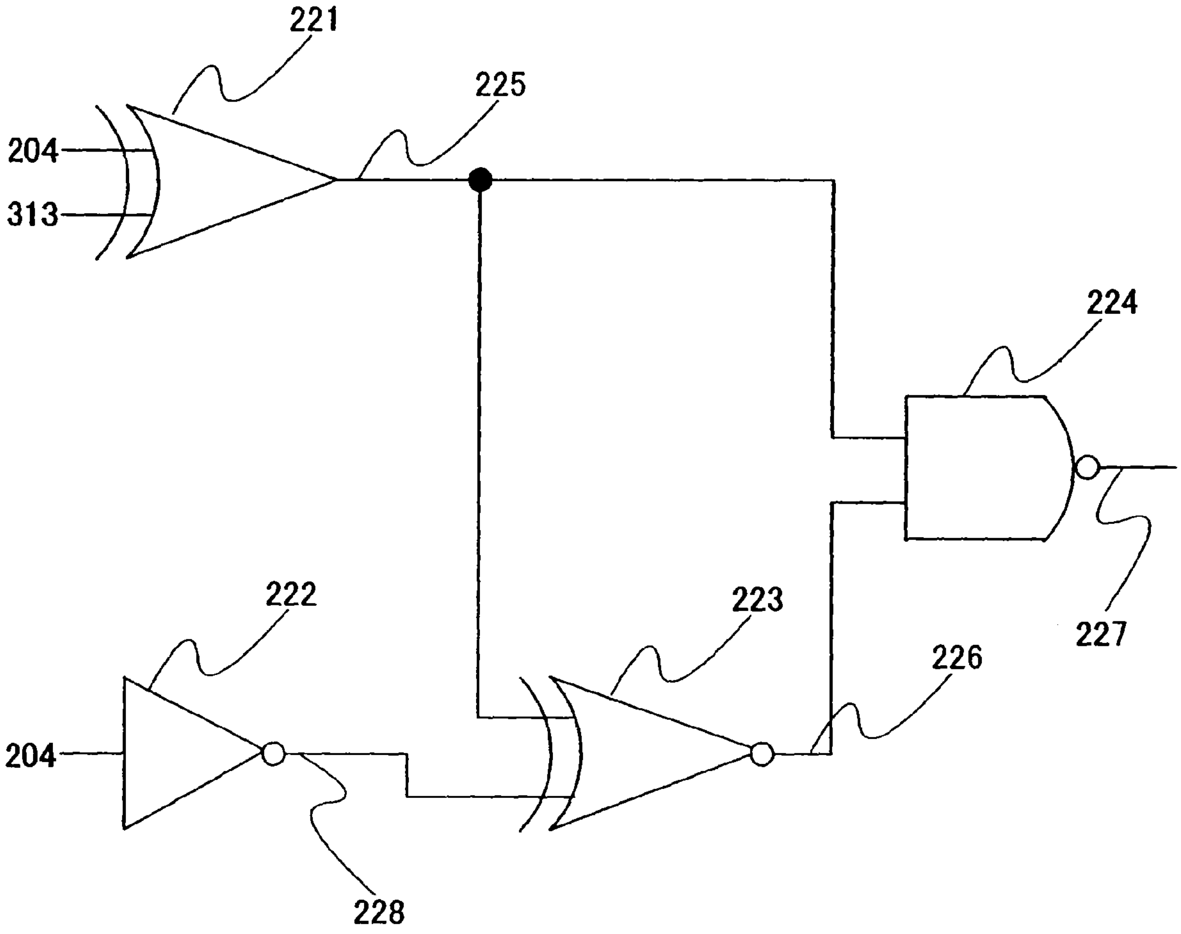
FIG. 4 is an inspecting circuit diagram 1.

Next, FIG. 4 shows a configuration example of the inspecting circuit of the invention. The inspecting circuit includes a source signal line 204, a G2WE line 313, a circuit A 221, a circuit B 222, a circuit C 223, and a circuit D 224.

An input portion of the circuit A 221 in FIG. 4 is connected to the source signal line 204 and the G2WE line 313. An input portion of the circuit B 222 is connected to the source signal line 204. An input portion of the circuit C 223 is connected to output portions of the circuit A 221 and the circuit B 222. An input portion of the circuit D 224 is connected to output portions of the circuit A 221 and the circuit C 223. An inspection result is outputted from an output portion of the circuit D 224.

Operations of the circuit A 221, the circuit B 222, the circuit C 223, and the circuit D 224 are described below. When L and L or H and H are inputted to the input portion of the circuit A 221, L is outputted, whereas when H and L or L and H are inputted to the input portion of the circuit A 221, H is outputted, which is as shown in a truth table of FIG. 5A. When L is inputted to the input portion of the circuit B 222, H is outputted, whereas when H is inputted to the input portion of the circuit B 222, L is outputted, which is shown in a truth table of FIG. 5B. When L and L or H and H are inputted to the input portion of the circuit C 223, H is outputted, whereas when H and L or L and H are inputted to the input portion of the circuit C 223, L is outputted, which is as shown in a truth table of FIG. 5C. When L and L, L and H or H and L are inputted to the input portion of the circuit D 224, L is outputted, whereas H and H are inputted to the input portion of the circuit D 224, L is outputted, which is as shown in a truth table of FIG. 5D.

Figure 6:
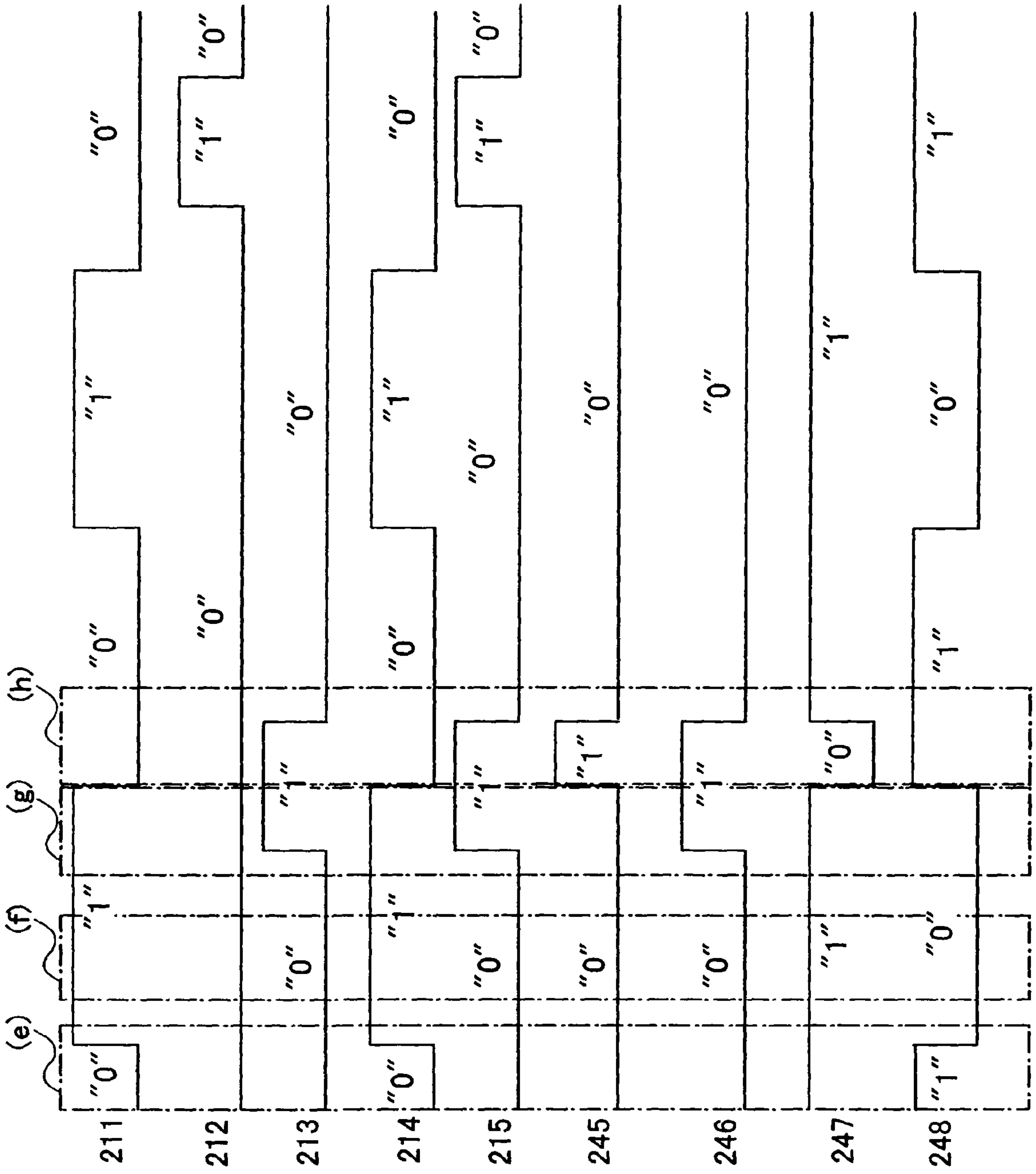
FIG. 6 is a timing chart of a circuit configuration of FIG. 4.

Hereinafter, operation of a circuit in FIG. 4 is described in detail with reference to FIG. 6. In FIG. 6, a signal of an output portion 225, a signal of an output portion 226, a signal of an output portion 227, and a signal of the output portion 228 are referred to as a signal 245, a signal 246, a signal 247, and a signal 248, respectively.

First, description is made of a signal in a frame (e) indicated by a dashed dotted line in FIG. 6. L and L are inputted to the circuit A 221, thereby the signal 245 of the output portion 225 is set to L. L is inputted to the circuit B 222, thereby the signal 248 of the output portion 228 is set to H. L of the signal 245 of the output portion 225 of the circuit A 221 and H of the signal 248 of the output portion 228 of the circuit B 222 are inputted to the circuit C 223, and thus the signal 246 of the output portion 226 is set to L. L of the signal 245 of the output portion 225 of the circuit A 221 and L of the signal 246 of the output portion 226 of the circuit C 223 are inputted to the circuit D 224, and thus the signal 247 of the output portion 227 is set to H.

Next, description is made of a signal in a frame (f) indicated by a dashed dotted line in FIG. 6. H and L are inputted to the circuit A 221, thereby the signal 245 of the output portion 225 is set to H. H is inputted to the circuit B 222, thereby the signal 248 of the output portion 228 is set to L. H of the signal 245 of the output portion 225 of the circuit A 221 and L of the signal 248 of the output portion 228 of the circuit B 222 are inputted to the circuit C 223, and thus the signal 246 of the output portion 226 is set to L. H of the signal 245 of the output portion 225 of the circuit A 221 and L of the signal 246 of the output portion 226 of the circuit C 223 are inputted to the circuit D 224, and thus the signal 247 of the output portion 227 is set to H.

Next, description is made of a signal in a frame (g) indicated by a dashed dotted line in FIG. 6. H and H are inputted to the circuit A 221, thereby the signal 245 of the output portion 225 is set to L. H is inputted to the circuit B 222, thereby the signal 248 of the output portion 228 is set to L. L of the signal 245 of the output portion 225 of the circuit A 221 and L of the signal 248 of the output portion 228 of the circuit B 222 are inputted to the circuit C 223, and thus the signal 246 of the output portion 226 is set to H. L of the signal 245 of the output portion 225 of the circuit A 221 and H of the signal 246 of the output portion 226 of the circuit C 223 are inputted to the circuit D 224, and thus the signal 247 of the output portion 227 is set to H.

Next, description is made of a signal in a frame (h) indicated by a dashed dotted line in FIG. 6. L and H are inputted to the circuit A 221, thereby the signal 245 of the output portion 225 is set to H. L is inputted to the circuit B 222, thereby the signal 248 of the output portion 228 is set to H. H of the signal 245 of the output portion 225 of the circuit A 221 and H of the signal 248 of the output portion 228 of the circuit B 222 are inputted to the circuit C 223, and thus the signal 246 of the output portion 226 is set to H. H of the signal 245 of the output portion 225 of the circuit A 221 and H of the signal 246 of the output portion 226 of the circuit C 223 are inputted to the circuit D 224, and thus the signal 247 of the output portion 227 is set to L.

As described above, when a signal having a display defect, that is a signal of a source signal line, is L and the G2WE 213 is H, a lag of the signal of the source signal line can be detected by the signal 247 of the output portion 227. It is determined as follows: the case where the signal 247 is H is normal, and the case where the output is L is abnormal. By thus referring to the output of the circuit D 224, whether there is a lag of a source signal or not can be detected.

EMBODIMENT MODE 2

Figure 7:
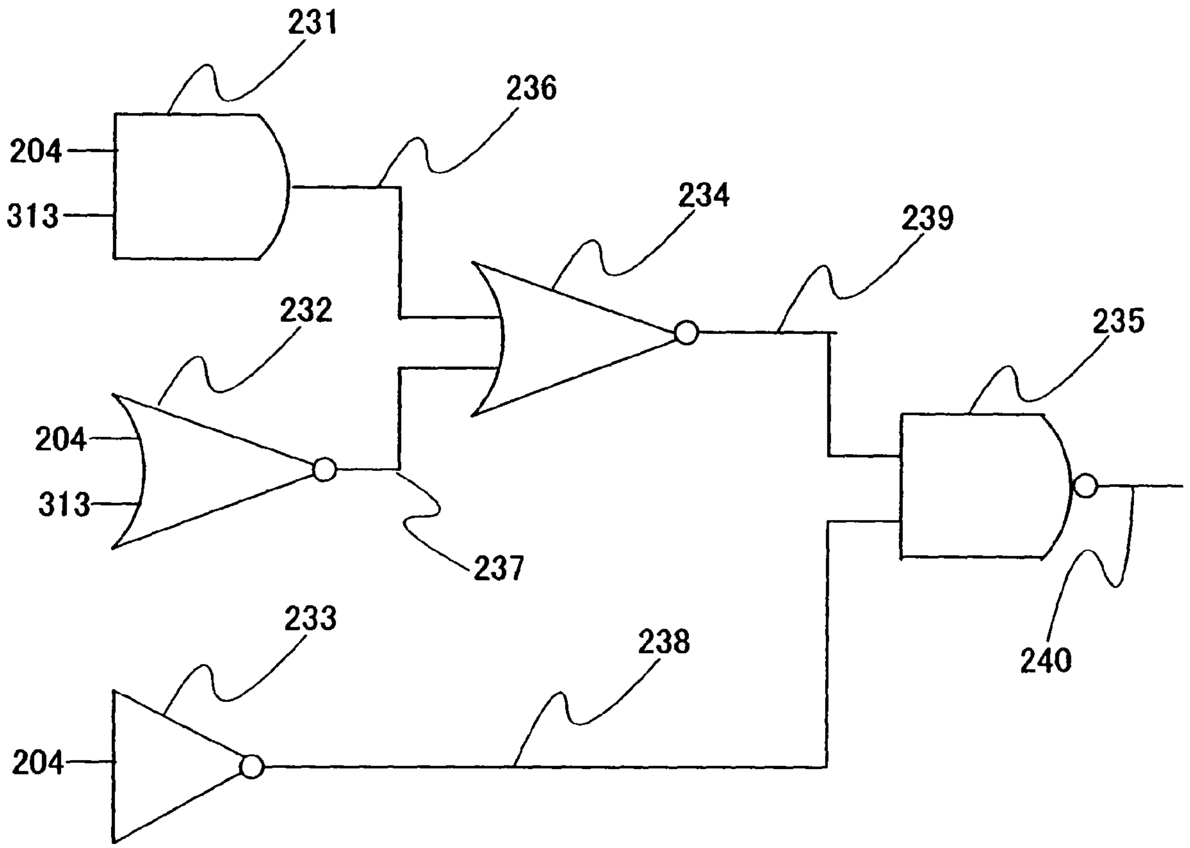
FIG. 7 is an inspecting circuit diagram 2.

Description is made of a mode other than Embodiment Mode 1 of the inspecting circuit of the invention with reference to FIG. 7. An output of this embodiment mode is the same as that of other embodiment modes.

The inspecting circuit of FIG. 7 includes a source signal line 204, a G2WE line 313, a circuit E 231, a circuit F 232, a circuit B 233, a circuit F 234, and a circuit D 235.

An input portion of the circuit E 231 is connected to the source signal line 204 and the G2WE line 313. An input portion of the circuit F 232 is connected to the source signal line 204 and the G2WE line 313. An input portion of the circuit B 233 is connected to the source signal line 204. An input portion of the circuit F 234 is connected to an output portion 236 of the circuit E 231 and an output portion 237 of the circuit F 232. An input portion of the circuit D 235 is connected to an output portion 239 of the circuit F 234 and an output portion 238 of the circuit B 233. An inspection result is outputted from an output portion 240 of the circuit D 235.

Hereinafter, operations of the circuit E 231, the circuit F 232, the circuit B 233, the circuit F 234, and the circuit D 235 are described. The circuit B 233 and the circuit D 235 operate similarly to the circuit B 222 and the circuit D 224 in FIG. 4 respectively, which are described in Embodiment Mode 1. When L and L, L and H, or H and L are inputted to the input portion of the circuit E 231, L is outputted, whereas only when H and H are inputted to the input portion, H is outputted, which is as shown in a truth table of FIG. 8A. When L and H, H and L, or H and H are inputted to the input portion of each of the circuit F 232 and the circuit F 234, L is outputted, whereas only when L and L are inputted to the input portion thereof, H is outputted, which is as shown in a truth table of FIG. 8B.

Hereinafter, operation of a circuit in FIG. 7 is described with reference to FIG. 9.

Figure 9:
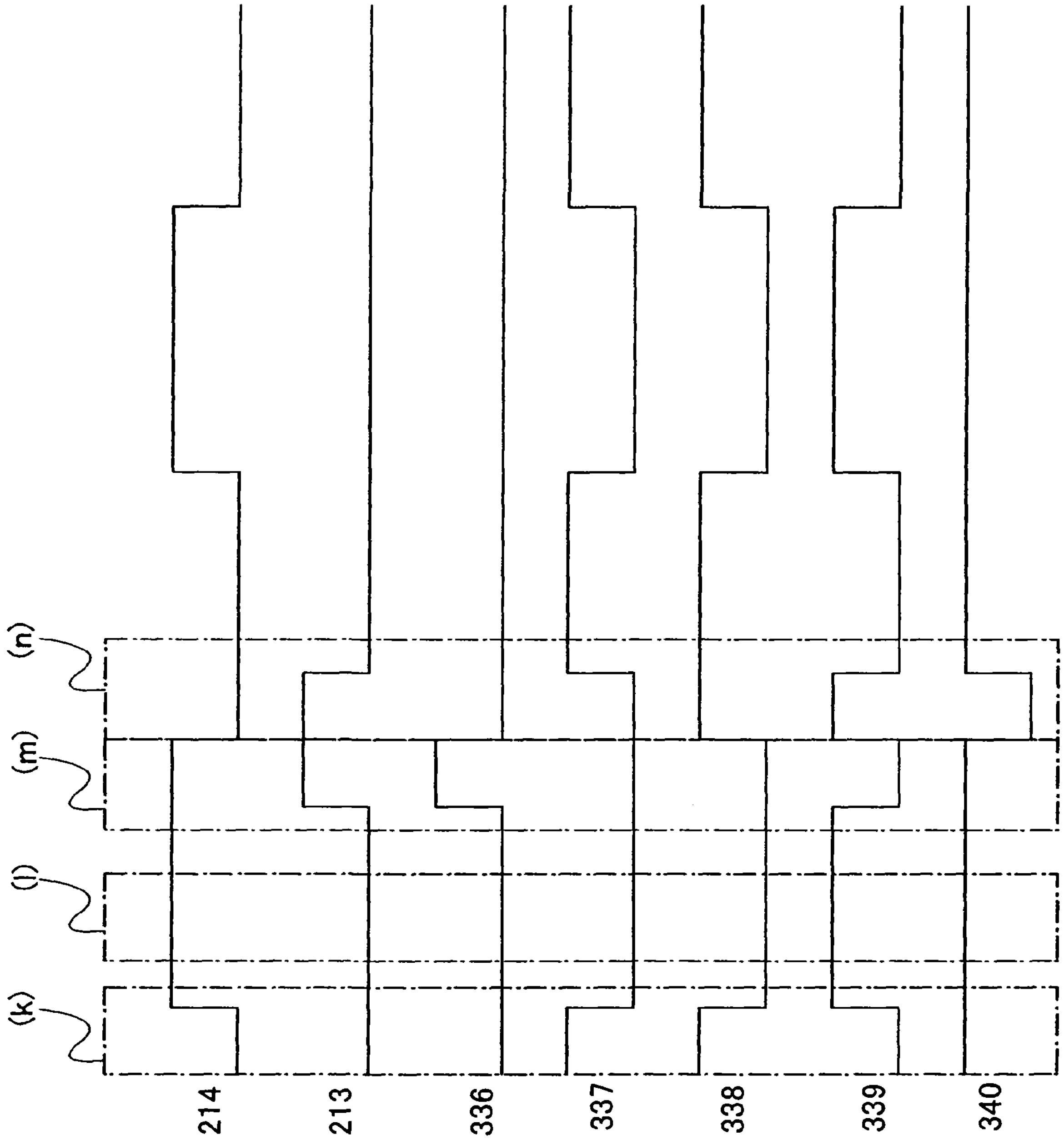
FIG. 9 is a timing chart of a circuit configuration of FIG. 7.

Description is made of a signal in a frame (k) indicated by a dashed dotted line in FIG. 9. Signals of L and L are inputted to the circuit E 231, thereby a signal 336 of the output portion 236 is set to L. The signals of L and L are also inputted to the circuit F 232, thereby a signal 337 of the output portion 237 is set to H. A signal of L is inputted to the circuit B 233, thereby a signal 338 of the output portion 238 is set to H. L of the signal 336 of the output portion 236 of the circuit E 231 and H of the signal 337 of the output portion 237 of the circuit F 232 are inputted to the circuit F 234, and thus a signal 339 of the output portion 239 is set to L. L of the signal 339 of the output portion 239 of the circuit F 234 and H of a signal 338 of the output portion 238 of the circuit B 233 are inputted to the input portion of the circuit D 235, and thus a signal 340 of the output portion 240 is set to H.

Next, description is made of a signal in a frame (l) indicated by a dashed dotted line in FIG. 9. Signals of H and L are inputted to the circuit E 231, thereby the signal 336 of the output portion 236 is set to L. The signals of H and L are also inputted to the circuit F 232, thereby the signal 337 of the output portion 237 is set to L. A signal of H is inputted to the circuit B 233, thereby the signal 338 of the output portion 238 is set to L. L of the signal 336 of the output portion 236 of the circuit E 231 and L of the signal 337 of the output portion 237 of the circuit F 232 are inputted to the circuit F 234, and thus the signal 339 of the output portion 239 is set to H. H of the signal 339 of the output portion 239 of the circuit F 234 and L of the signal 338 of the output portion 238 of the circuit B 233 are inputted to the input portion of the circuit D 235, and thus the signal 340 of the output portion 240 is set to H.

Next, description is made of a signal in a frame (m) indicated by a dashed dotted line in FIG. 9. Signals of H and H are inputted to the circuit E 231, thereby the signal 336 of the output portion 236 is set to H. The signals of H and H are also inputted to the circuit F 232, thereby the signal 337 of the output portion 237 is set to L. A signal of H is inputted to the circuit B 233, thereby the signal 338 of the output portion 238 is set to L. H of the signal 336 of the output portion 236 of the circuit E 231 and L of the signal 337 of the output portion 237 of the circuit F 232 are inputted to the circuit F 234, and thus the signal 339 of the output portion 239 is set to L. L of the signal 339 of the output portion 239 of the circuit F 234 and L of the signal 338 of the output portion 238 of the circuit B 233 are inputted to the input portion of the circuit D 235, and thus the signal 340 of the output portion 240 is set to H.

Next, description is made of a signal in a frame (n) indicated by a dashed dotted line in FIG. 9. Signals of L and H are inputted to the circuit E 231, thereby the signal 336 of the output portion 236 is set to L. The signals of L and H are also inputted to the circuit F 232, thereby the signal 337 of the output portion 237 is set to L. A signal of L is inputted to the circuit B 233, thereby the signal 338 of the output portion 238 is set to H. L of the signal 336 of the output portion 236 of the circuit E 231 and L of the signal 337 of the output portion 237 of the circuit F 232 are inputted to the circuit F 234, and thus the signal 339 of the output portion 239 is set to H. H of the signal 339 of the output portion 239 of the circuit F 234 and H of the signal 338 of the output portion 238 of the circuit B 233 are inputted to an input of the circuit D 235, and thus the signal 340 of the output portion 240 is set to L.

As described above, a signal can be detected similarly to Embodiment Mode 1. When a signal having a display defect, that is a signal of a source signal line, is L and the G2WE 213 is H, a lag of a signal can be detected by the signal 340 of the output portion 240. It is determined as follows: the case where the signal 340 is H is normal, and the case where the output is L is abnormal. By thus referring to the output of the circuit D 235, whether there is a lag of a source signal or not can be detected.

EMBODIMENT MODE 3

Figure 10:
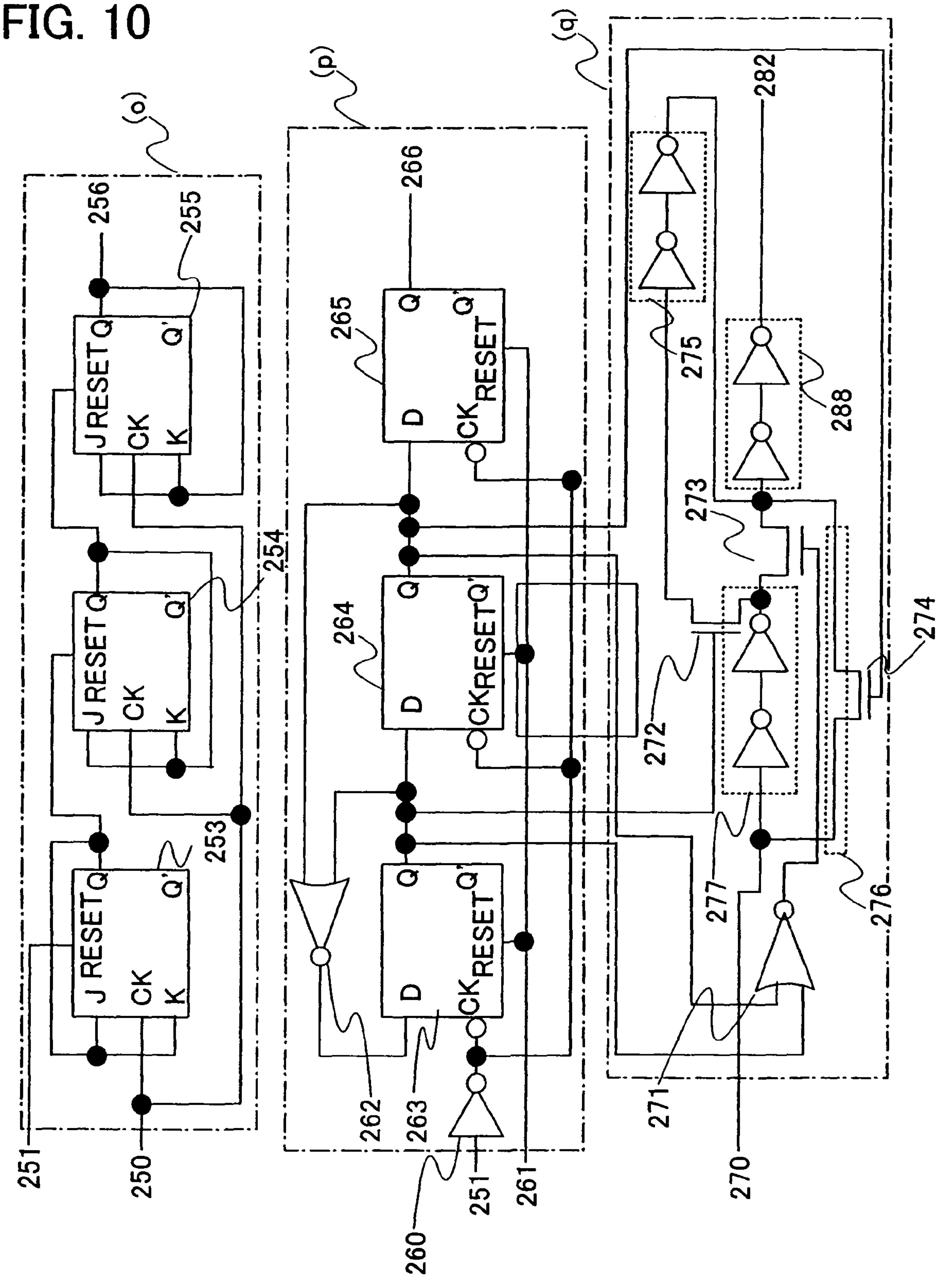
FIG. 10 is a signal correcting circuit diagram.

FIG. 10 shows an example of a circuit combining the inspecting circuit and the signal correcting circuit of the invention. The circuit shown in FIG. 4 is used as the inspecting circuit. The circuit in FIG. 7 can be used instead of the circuit in FIG. 4.

Figure 11:
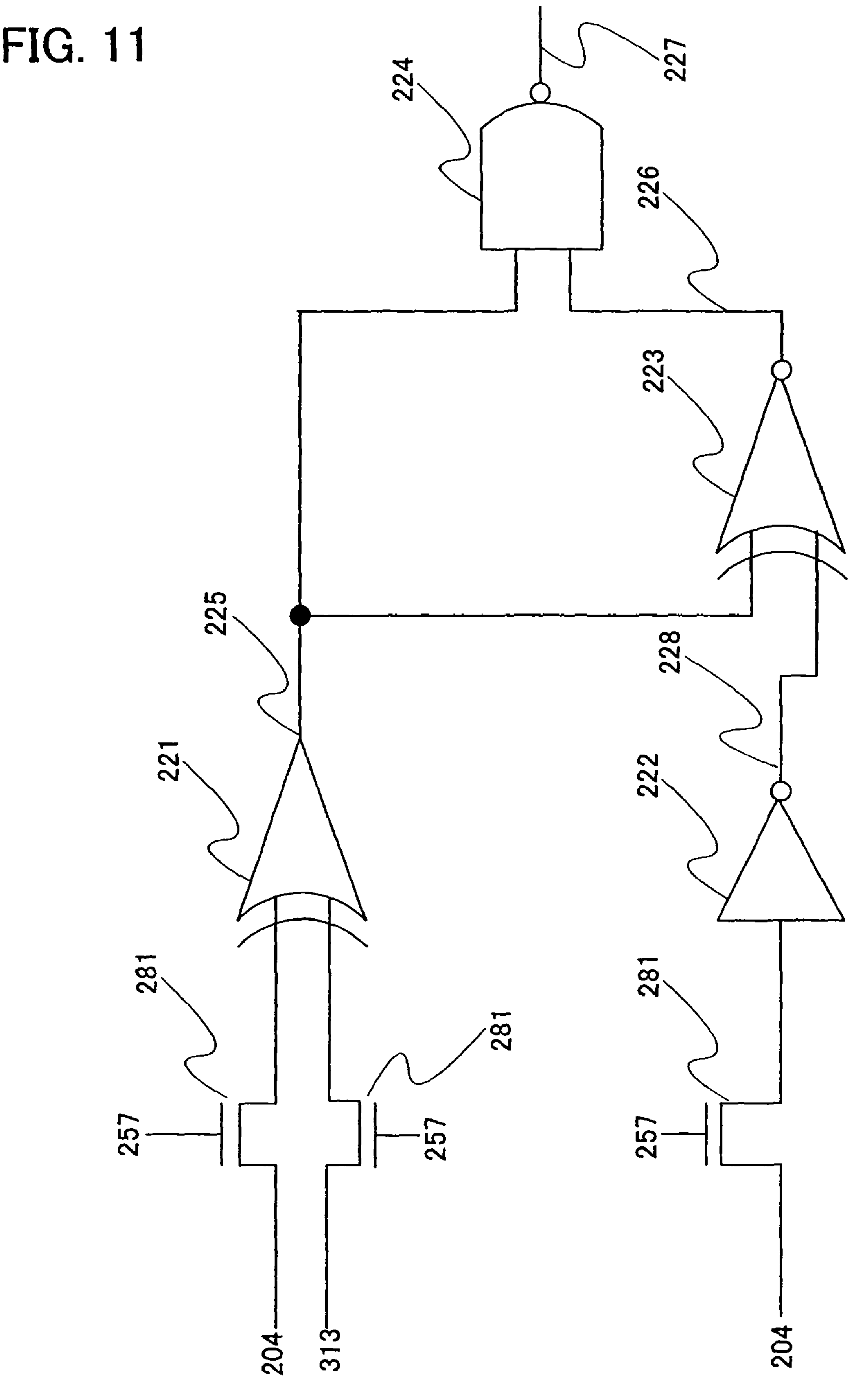
FIG. 11 is an inspecting circuit diagram 3.

The circuit in FIG. 10 includes a counter circuit surrounded by a dashed dotted line (o), a counter circuit surrounded by a dashed doted line (p), and a buffer circuit of a gate signal line surrounded by a dashed dotted line (q). Further, FIG. 11 shows a configuration example of an inspecting circuit. The inspecting circuit includes the source signal line 204, the G2WE line 313, the circuit A 221, the circuit B 222, the circuit C 223, and the circuit D 224.

First, the counter circuit surrounded by the dashed dotted line (o) is described. A gate signal line 250 is connected to CK portions of JK flip-flop circuits 253, 254, and 255. An output portion 227 of the inspecting circuit is connected to a RESET portion of the JK flip-flop circuit 253. (251 is connected to the output portion 227 of the inspecting circuit in FIG. 10.) A Q portion of the JK flip-flop circuit 253 is connected to a RESET portion of the JK flip-flop circuit 254, and a J portion and a K portion of the JK flip-flop circuit 253 as well. A Q portion of the JK flip-flop circuit 254 is connected to a RESET portion of the JK flip-flop circuit 255, and a J portion and a K portion of the JK flip-flop circuit 254 as well. A Q portion of the JK flip-flop circuit 255 is connected to gate electrodes 257 of switches 281 in an input portion of the inspecting circuit in FIG. 11, and a J portion and a K portion of the JK flip-flop circuit 255 as well. It is to be noted that FIG. 11 shows a structure where the switches 281 are provided in input portions of FIG. 4.

The counter circuit surrounded by the dashed dotted line (p) is described. The output portion 227 of the inspecting circuit is connected to CK portions of D flip-flop circuits 263, 264, and 265 through a circuit B 260. A reset signal line 261 is connected to RESET portions of the D flip-flop circuits 263, 264, and 265. A Q portion of the D flip-flop circuit 263 is connected to a D portion of the D flip-flop circuit 264 and an input portion of a circuit F 262. A Q portion of the D flip-flop circuit 264 is connected to a D portion of the D flip-flop circuit 265 and the input portion of the circuit F 262. An output portion of the circuit F 262 is connected to a D portion of the D flip-flop circuit 263.

An output portion 266 of the counter circuit surrounded by the dashed dotted line (p) may have a structure such that the output portion 266 does not affect the circuits in FIG. 10 since the output portion 266 is not used in the circuit configuration of the invention. For example, the output portion 266 may be connected to a ground line or the like.

The buffer circuit of the gate signal line surrounded by the dashed dotted line (q) is described. A buffer circuit 275 and a wiring 276 are additionally provided in the conventional buffer circuit. An input portion of a circuit F 271 is connected to the Q portions of the D flip-flop circuits 263 and 264. An output portion of the circuit F 271 is connected to a gate electrode of a switch 273. A gate electrode of a switch 272 is connected to the Q portion of the D flip-flop circuit 263. A switch 274 is connected to the Q portion of the D flip-flop circuit 264. An input portion of the buffer circuit 275 is connected to the switch 272, and an output portion of the buffer circuit 275 is connected between the switch 273 and a buffer circuit 288. A wiring 276 connects an input portion of a buffer circuit 277, and the switch 273 and the buffer circuit 288.

Hereinafter, operations of circuit diagrams of FIGS. 10 and 11 are described with reference to FIG. 12.

Figure 12:
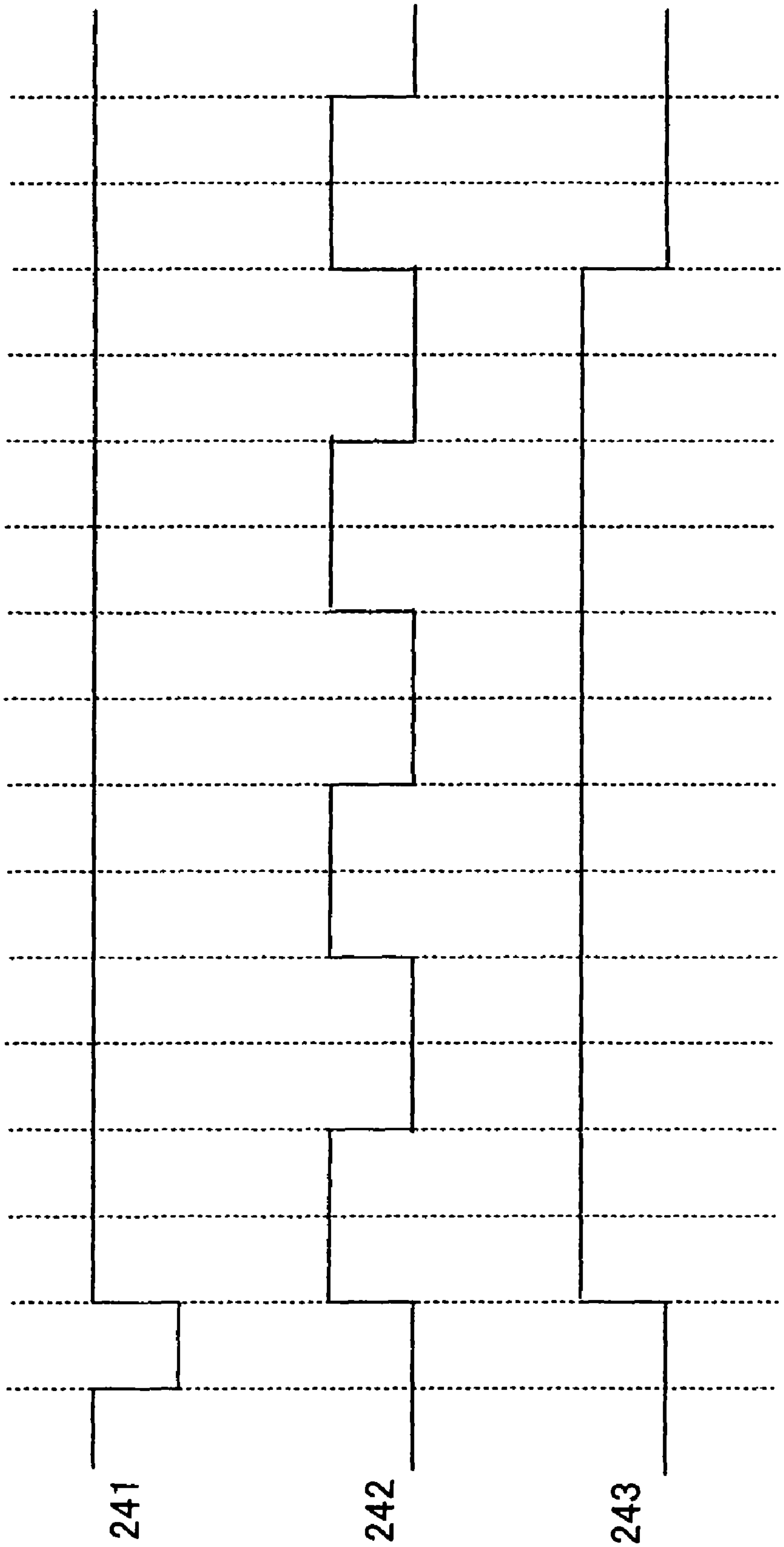
FIG. 12 is a timing chart of a circuit configuration of FIG. 11.

An output of a inspecting circuit shown by a signal 241 in FIG. 12 is inputted to the RESET portion of the JK flip-flop circuit 253 included in the circuit surrounded by the dashed dotted line (o) in FIG. 10. The signal 241 is a signal outputted from the output portion 227 of the inspecting circuit in FIG. 4 or the output portion 240 of the inspecting circuit in FIG. 7. Accordingly, the JK flip-flop circuit 253 is reset. After that, from a rise of the signal of the gate signal line 250, which is inputted to a CK portion of the JK flip-flop circuit 253, that is a rise of a signal 242 in FIG. 12, reading starts to be performed. The JK flip-flop circuits 254 and 255 operate in a similar manner. By these operations, as shown by a signal 243 in FIG. 12, the signal 243 outputted from an output portion 256 is H for the time of three periods counted on a basis of the signal 242 of the gate signal line 250. This signal is inputted to the switch 281 of FIG. 11. The switch 281 is connected to the gate electrode 257 of the switch 281 so as to be turned off when the signal 243 to be outputted is H. Therefore, when the signal 243 is H, the inspecting circuit of FIG. 11 does not operate. Meanwhile, when the signal 243 changes from H to L, the switch 281 is turned on, and the inspecting circuit of FIG. 11 starts operating again.

A reset signal is inputted to a RESET portion of the D flip-flop circuit 263 included in the counter circuit surrounded by the dashed dotted line (p) in FIG. 10. This reset signal is a signal to be H when a signal of L is outputted from the inspecting circuit of FIG. 11. That is, an output portion of the inspecting circuit in FIG. 11 may be connected through the circuit B. An output of the inspecting circuit in FIG. 11 is inputted to a CK portion of the D flip-flop circuit 263 through the circuit B 260. When the output of the inspecting circuit in FIG. 11 is L, the Q portion of the D flip-flop circuit 263 is H. The Q portion of the D flip-flop circuit 263 keeps to hold H until the next time L is outputted from the inspecting circuit. When the next time L is outputted from the inspecting circuit, the Q portion of the D flip-flop circuit 263 is set to L, and the Q portion of the D flip-flop circuit 264 is set to H. Here, the Q portion of the D flip-flop circuit 263 keeps to hold H until L is outputted from the inspecting circuit next.

The Q portions of the D flip-flop circuits 263 and 264 are connected to the circuit F 271 included in the circuit surrounded by the dashed dotted line (q) in FIG. 10. This circuit is a circuit which outputs H only when L and L are inputted. Therefore, L and L are inputted when the output of the inspecting circuit in FIG. 11 is H, thereby the output is set to H. Meanwhile, L and H or H and L are inputted when the output of the inspecting circuit in FIG. 11 is L, thereby the output is set to L. The switches 272, 273, and 274 are switches which are turned on when gate electrodes thereof are H, and turned off when the gate electrodes thereof are L. The switch 273 is on when a gate electrode thereof is L, and off a gate electrode thereof is H. The switch 272 determines to be on or off depending on a state of the Q portion of the D flip-flop circuit 263. The switch 273 is off only when L and L are inputted to the circuit F 271.

In the inspecting circuit of FIG. 11, when L is outputted, the Q portion of the D flip-flop circuit 263 included in the circuit surrounded by the dashed dotted line (q) is set to H, thereby the switch 272 is turned on as soon as the switch 273 is turned off, and the Q portion thereof is connected to the buffer circuit 275 through the switch 272. As a result, a buffer circuit of the gate signal line is extended, seen as a whole, and the signal of the gate signal line can be delayed, thereby a defect can be corrected. This state is maintained for the time of three periods counted on the basis of the signal 242 of the gate signal line 250. After that, the inspecting circuit of FIG. 11 is operated again to conduct an inspection. If the inspection result is normal, the state is maintained as it is. If abnormal, L is outputted from the inspecting circuit of FIG. 11, the Q portion of the D flip-flop circuit 263 of the circuit surrounded by the dashed dotted line (q) in FIG. 10 is set to L, and the Q portion of the D flip-flop circuit 264 is set to H. Therefore, the switches 272 and 273 are turned off, and the switch 274 is turned on. Afterwards, the inspecting circuit is operated similarly in the aforementioned manner.

According to this embodiment mode described above, if the timing of a signal of the driver circuit of the gate signal line lags when a signal to be written to a pixel from the driver circuit of the source signal line, the lagged defect signal is detected and corrected, thereby the timing of a scan signal can be corrected in accordance with a signal from a source driver. As a result, a display defect can be prevented.

Therefore, the invention is preferably applied to a display portion of an electronic appliance which drives with a battery, display portions of a display device and an electronic appliance with a large display screen, or the like. For example, the invention can be mounted on a television device (television or television receiver), a camera such as a digital camera, a digital video camera, or the like, a mobile phone, a portable information terminal such as a PDA, a portable game machine, a monitor, a computer, an audio reproducing device provided with a display portion, such as a car audio system, an image reproducing device provided with a recording medium, such as a home game machine, or the like.

Figure 13A:
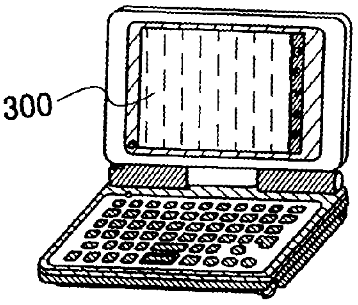
FIGS. 13A to 13F each show an explanatory diagram of an electronic appliance using a light emitting device.
Figure 13B:
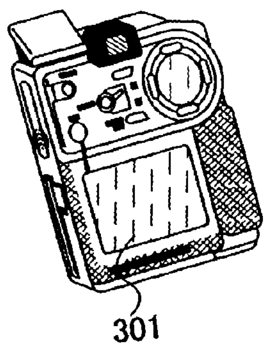
Figure 13C:
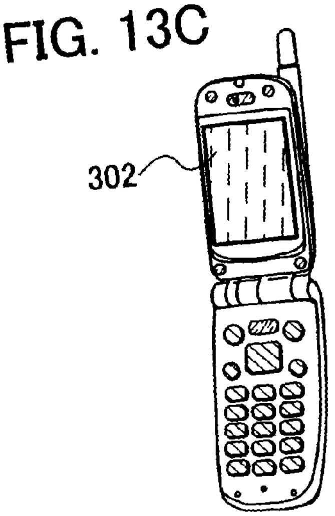
Figure 13D:
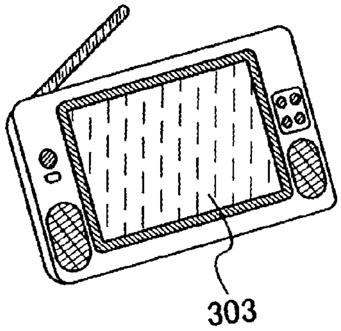
Figure 13E:
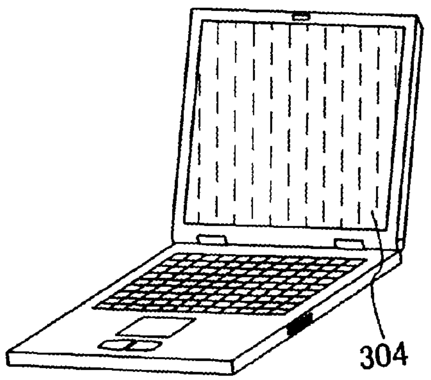
Figure 13F:
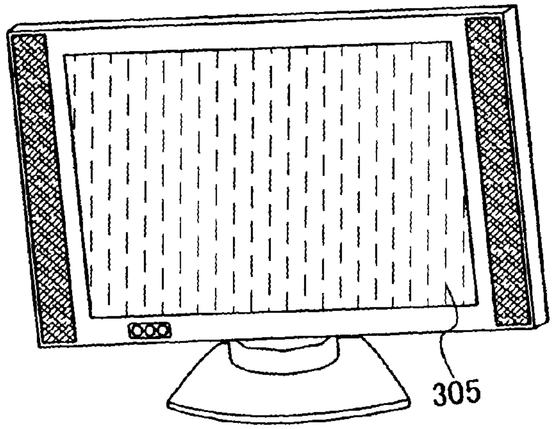

Description is made of the aforementioned example with reference to FIGS. 13A to 13F. FIG. 13A shows a portable information terminal, FIG. 13B shows a digital video camera, FIG. 13C shows a mobile phone, FIG. 13D shows a portable television device, FIG. 13E shows a laptop computer, and FIG. 13F shows a television device. A light emitting device using the invention can be mounted on each of display portions 300 to 305.

This application is based on Japanese Patent Application serial no. 2005-307715 filed in Japan Patent Office on 21 Oct. 2005, the entire contents of which are hereby incorporated by reference.

What is claimed is:

1. A display device comprising:
- a gate signal line;
- a source signal line;
- a driver circuit which outputs a signal to the gate signal line and which includes a shift register circuit ;
- a switch configured to connect the gate signal line to the shift register circuit;
- a pixel connected to the gate signal line and the source signal line, to which a signal is written from the source signal line when the gate signal line is selected;
- a wiring to which a signal for controlling the switch is inputted; and
- an inspecting circuit connected to the source signal line and the wiring, the inspecting circuit detecting whether a potential of the source signal line is a potential for making the pixel emit no light when the switch changes from being in an on state to being in an off state,
- wherein the driver circuit comprises a signal correcting circuit for correcting a timing to output a signal to the gate signal line in accordance with the detection by the inspecting circuit of whether the potential of the source signal line is the potential for making the pixel emit no light.

2. The display device according to claim 1,
- wherein the signal correcting circuit comprises a plurality of buffer circuits; and
- wherein the plurality of buffer circuits are connected in series.

3. An electronic appliance comprising the display device according to claim 1.

4. The display device according to claim 1, wherein the signal correcting circuit comprises first to third buffer circuits, and corrects the timing to output the signal to the gate signal line in accordance with a first state in which a signal is outputted through the first and second buffer circuits, a second state in which a signal is outputted through the first to third buffer circuits, or a third state in which a signal is outputted through the first buffer circuit.

5. A display device comprising:
- a gate signal line;
- a source signal line;
- a first driver circuit which outputs a signal to the gate signal line and comprises a shift register circuit;
- a second driver circuit which outputs a signal to the source signal line;
- a switch configured to connect the gate signal line to the shift register circuit;

a pixel connected to the gate signal line and the source signal line, to which a signal is written from the source signal line when the gate signal line is selected;

a wiring to which a signal for controlling the switch is inputted; and an inspecting circuit connected to the source signal line and the wiring, the inspecting circuit detecting whether a potential of the source signal line is a potential for making the pixel emit no light when the switch changes from being in an on state to being in an off state, wherein the first driver circuit further comprises a signal correcting circuit for correcting a timing to output a signal to the gate signal line in accordance with the detection by the inspecting circuit of whether the potential of the source signal line is the potential for making the pixel emit no light.

6. The display device according to claim 5, wherein the signal correcting circuit comprises a plurality of buffer circuits; and wherein the plurality of buffer circuits are connected in series.

7. The display device according to claim 6, wherein the number of the plurality of buffer circuits connected in series is reduced when a timing of the signal is late, as compared to when a timing of the signal is not late.

8. The display device according to claim 6, wherein the number of the plurality of buffer circuits connected in series is increased when a timing of the signal is early, as compared to when a timing of the signal is not early.

9. The display device according to claim 5, wherein the signal correcting circuit comprises first to third buffer circuits, and corrects the timing to output the signal to the gate signal line in accordance with a first state in which a signal is outputted through the first and second buffer circuits, a second state in which a signal is outputted through the first to third buffer circuits, or a third state in which a signal is outputted through the first buffer circuit.

* * * * *